United States Patent [19]
Pan et al.

[11] Patent Number: 5,465,059
[45] Date of Patent: Nov. 7, 1995

[54] METHOD AND APPARATUS FOR TIMING ACQUISITION OF PARTIAL RESPONSE CLASS IV SIGNALING

[75] Inventors: Tzu-Wang Pan, Irvine; Richard Yamasaki, Torrance, both of Calif.

[73] Assignee: Silicon Systems, Inc., Tustin, Calif.

[21] Appl. No.: 228,758

[22] Filed: Apr. 18, 1994

[51] Int. Cl.$^6$ .................................................. G01R 29/00
[52] U.S. Cl. ................................................ 327/12; 327/74
[58] Field of Search .............................. 327/2, 3, 12, 18, 327/72, 73, 165, 166, 144, 145, 74; 360/46, 51, 65; 375/316, 329, 324, 330, 325, 331, 327, 332

[56] References Cited

U.S. PATENT DOCUMENTS 4,975,897  12/1990  Tanahashi ................................. 360/46
5,373,400  12/1994  Kovacs ...................................... 360/46

Primary Examiner—Timothy P. Callahan
Assistant Examiner—Jeffrey Zweizig
Attorney, Agent, or Firm—Hecker & Harriman

[57] ABSTRACT

A method and apparatus for timing acquisition of partial response class IV Signaling is described. The invention uses an acquisition logic block to determine an output sequence that best matches a preamble pattern. The logic block analyzes current quantizer output X and the two previous decisions $X_n$ and $X_{n-1}$. The logic uses these values to determine the next value $X_{n+1}$ so that the best match occurs. The invention is implemented with OR gates, AND gates, and D flip-flops and can operate in acquiring mode or tracking mode.

23 Claims, 4 Drawing Sheets

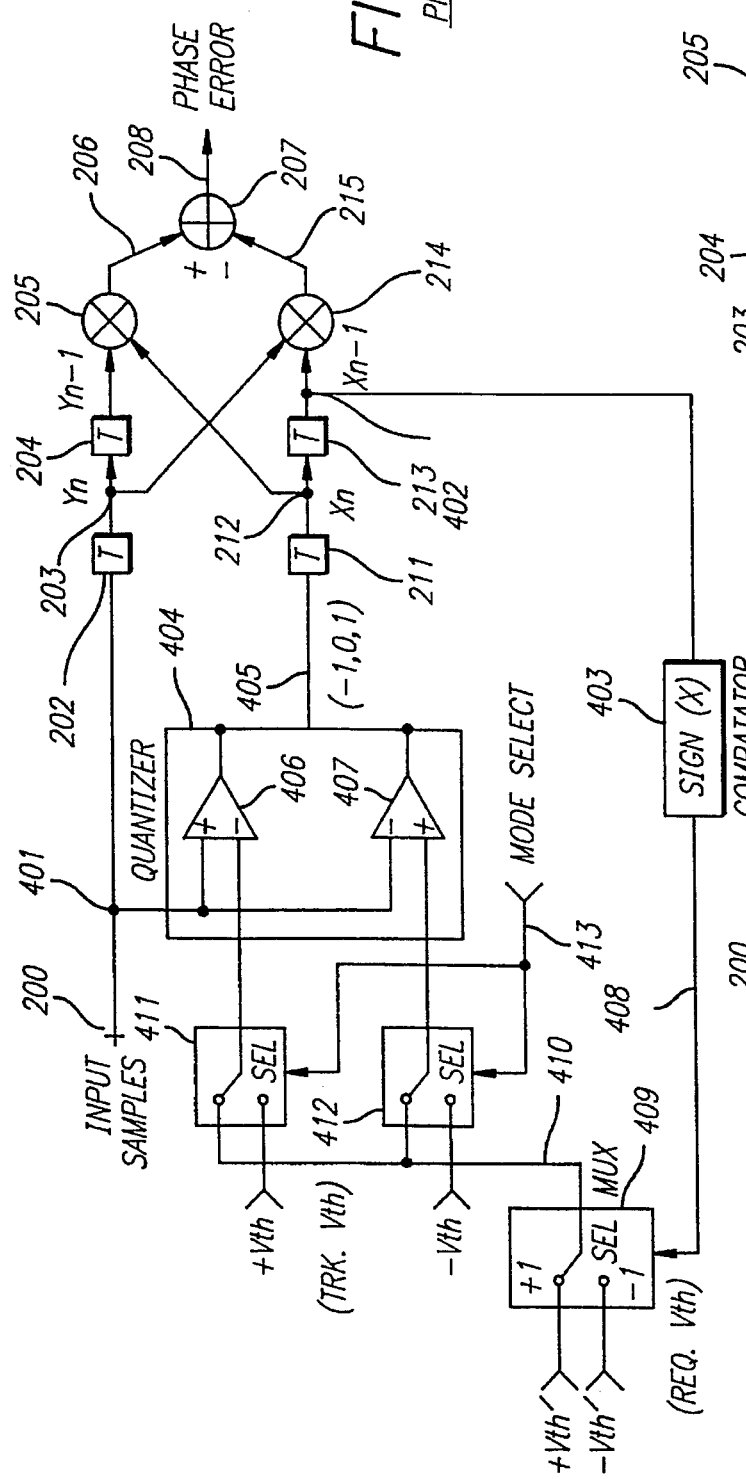
FIG. 4 _PRIOR ART_
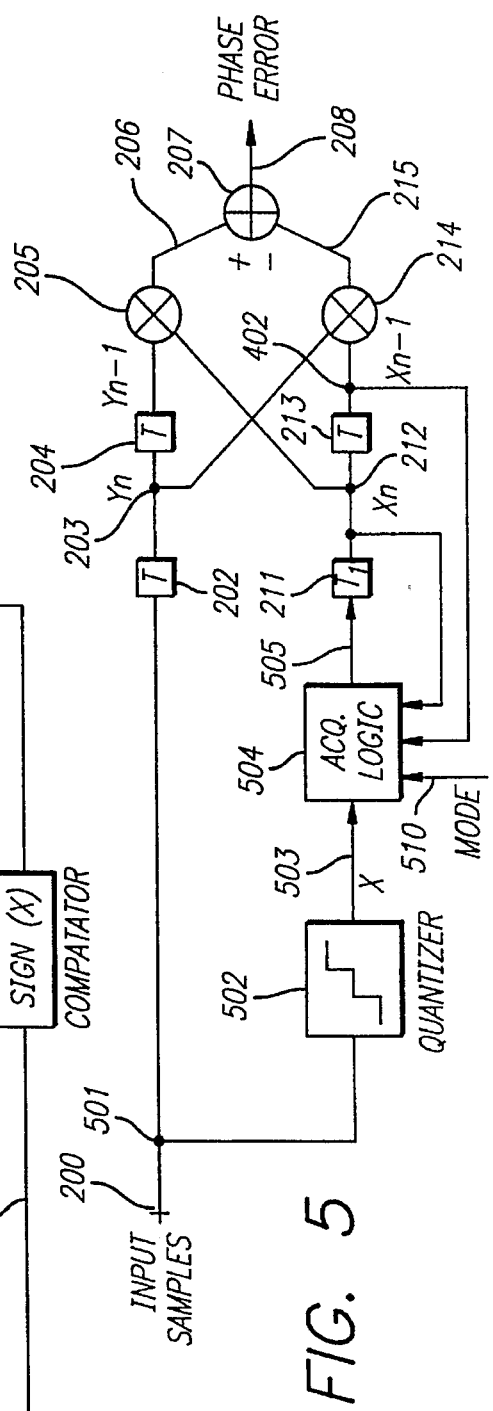
FIG. 5

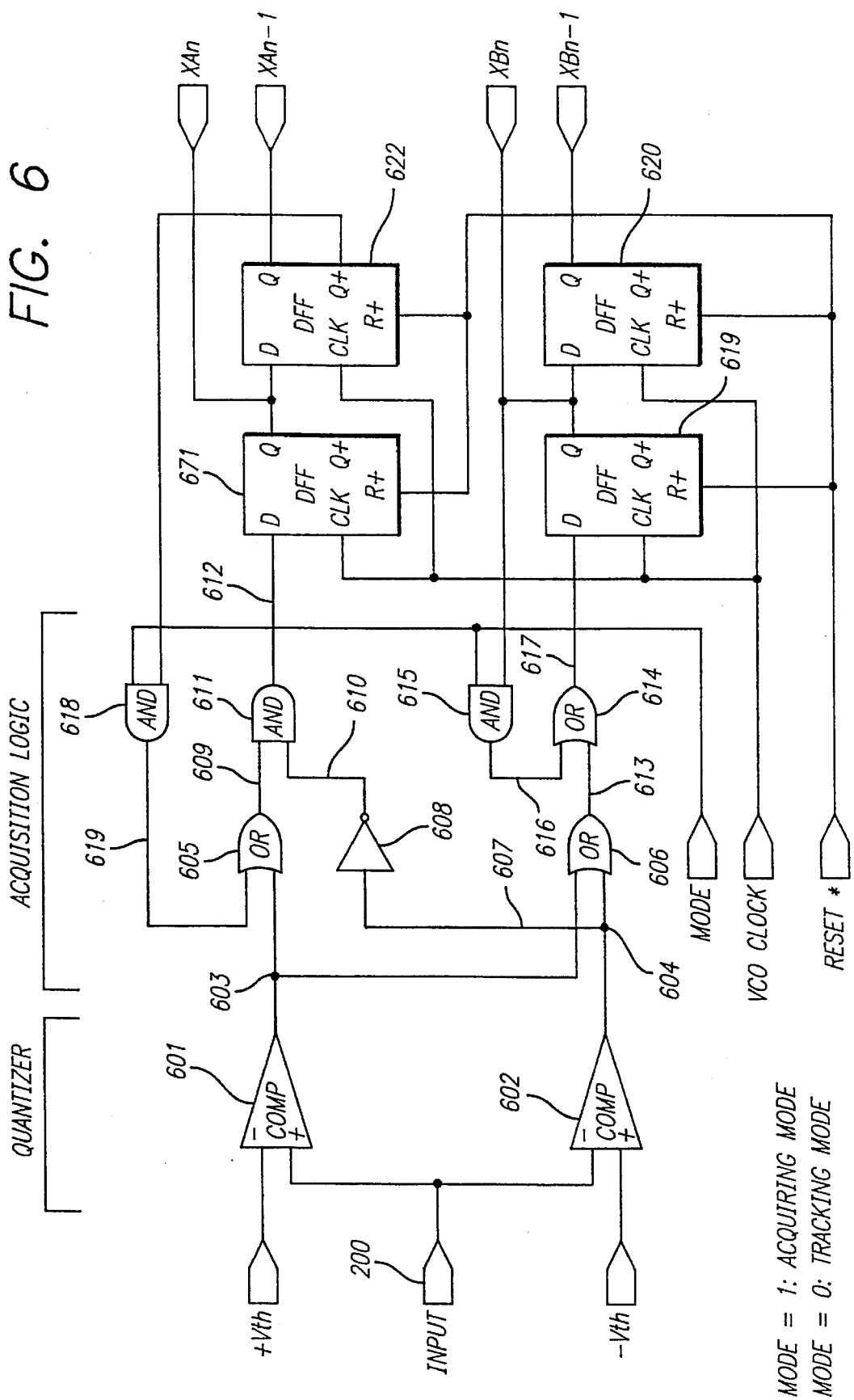

METHOD AND APPARATUS FOR TIMING ACQUISITION OF PARTIAL RESPONSE CLASS IV SIGNALING

BACKGROUND OF THE INVENTION

1. Field of the Invention

This invention relates to the field of data recording and detecting schemes.

2. Background Art

In computer systems, information is stored on magnetic storage systems such as Winchester type hard disks or floppy disks. Data is stored in a series of spiral or concentric rings known as "tracks". The data consists of streams of transitions of polarity of magnetic particles on the disk surface. A number of schemes are used to detect these transitions and data.

One prior art data detection method is a peak detection system. A disadvantage of peak detection schemes is limited data density. Another prior art data detection scheme is known as partial-response class IV (PR-IV) signaling. Systems using PR-IV schemes can achieve higher recording density than the conventional peak detection systems.

In PR-IV systems, input signals are sampled before performing symbol sequence detection. An example of a prior art PR-IV decoder is illustrated in FIG. 1. An input signal is coupled to one terminal of switch 101. The other terminal of switch 101 is coupled to node 102. Node 102 is coupled as an input to symbol sequence detector 103. The output 104 of symbol sequence detector 103 is decoded data. Node 102 is also coupled to a timing recovery circuit indicated by dashed line 105. Timing recovery circuit 105 is comprised of phase detector 106, loop filter 108 and VCO 110. Node 102 is coupled as an input to phase detector 106. The output 107 of phase detector 106 is coupled as an input to loop filter 108. Loop filter 108 provides an output 109 to VCO 110. The output 111 of VCO 110 is a sampling clock signal that controls switch 101.

The timing recovery circuit 105 is required to adjust the clock signal for the sampler so that frequency drifts between oscillators in the send and receive circuits can be compensated for. This timing recovery circuit is typically a phase-locked loop (PLL) consisting of a sampled-data phase detector. The phase detector determines the phase error between the input signal and a VCO by computing the timing gradient from the sampled data values. Timing recovery is described in K. H. Mueller and M. Muller, "Timing Recovery in Digital Synchronous Data Receivers", IEEE Trans. Commun., vol. COM-24, pp. 516–530, May, 1976.

For PR-IV systems, phase error $\Delta\tau$ can be determined by:

$$\Delta\tau = y_n * X_{n-1} + y_{n-1} * X_n \quad (1)$$

where $y_n$ is the input sample value at time nT, $x_n$ is the quantized decision value of $y_n$ and T is the clock period of the system symbol rate. In a PR-IV system, $x_n$ can have a value of +1, 0, or −1.

A prior art system block diagram for implementing equation (1) is illustrated in FIG. 2. FIG. 2 is a phase detector for implementing a tracking mode. Input samples 200 are coupled to node 201. Node 201 is coupled to a delay 202. The output $Y_n$ of delay 202 is coupled to node 203. Node 203 is coupled to delay 204. Node 204 provides an output $Y_n-1$ to multiplier 205. The output 206 of multiplier 205 is coupled to the noninverting input of summing node 207. The output 208 of summing node 207 is a phase error signal $\Delta\tau$.

Node 201 is also coupled as an input of quantizer 209. Quantizer 209 provides an output 210 to delay 211. The output of delay 211 at node 212 is signal $X_n$. $X_n$ is coupled as an input to delay 213 and as an input to multiplier 205. The output of delay 213, $X_n-1$ is provided as an input to multiplier 214 along with $Y_n$ from node 203. The output 215 of multiplier 214 is coupled to the inverting input of summing node 207. In the embodiment illustrated, the transition curve of the quantizer has a range of −1, 0, and 1 for $X_n$.

To assist the initial acquisition of the timing phase, a preamble sequence precedes the actual data. A commonly used preamble pattern for PR-IV has a received sample sequence {. . . −1, −1, +1, +1, −1, −1, +1, +1 . . . }such as illustrated in FIG. 3. FIG. 3 illustrates a PR-IV preamble pattern mapped as y versus time. The pattern provides alternating pairs of +1's and −1's. This pattern has the most number of transitions in a given period of time. However, a timing recovery scheme that only implements equation (1) often fails to acquire the correct timing. This simple scheme can falsely lock because a phase shift of T/2 will produce zero phase shift error. Therefore, a different algorithm is required during the acquisition phase.

A "variable threshold decision" (VTD) algorithm was proposed by F. Dolivo etc. in U.S. Pat. No. 4,890,299 entitled "Fast Timing Acquisition for Partial-Response Signaling", and "Fast Tinning Recovery for Partial-Response Signaling Systems", F. Dolivo, W. Schott, and G. Ungerbock, IEEE International Conference on Communications, June, 1989, pages 573–577. The VTD scheme forces the system to recognize the preamble pattern by reducing the number of thresholds in the quantizer to one and dynamically changing this threshold level based on the data received. This scheme is illustrated in FIG. 4.

FIG. 4 illustrates the prior art VDT algorithm for acquiring the PR-IV preamble pattern. Input samples 200 are provided to node 401. Node 401 is coupled to delay 202. The output of delay of 202 is signal $Y_n$ at node 203. $Y_n$ is coupled as an input to delay 204 and to multiplier 214. The output of multiplier 204 is signal $Y_n-1$ and is provided as an input to multiplier 205 along with signal $X_n$ from node 212. The output 206 of multiplier 205 is provided as input to the non-inverting input of summer 207. The output of summer 207 is phase error 208. Node 401 is also coupled to quantizer enclosed in block 404. The output 405 of quantizer 404 has a value of −1, 0 or 1 and is provided as an input to delay 211. The output of delay 211 at node 212 is signal $X_n$. $X_n$ is provided as an input to delay 213 and as an input to multiplier 205.

The output of delay 213 is signal $X_n-1$ at node 402. The signal is provided as an input to multiplier 214. The output 215 of multiplier 214 is coupled to the inverting input of summer 207. Node 402 is coupled to comparator 403 which is a sign (X) comparator. The output 408 of comparator 403 is coupled to the select input of switch 409. Signal +Vth' and signal −Vth' are coupled as inputs to multiplexer 409. The signal 408 selects between these inputs. The output 410 of multiplexer 409 is coupled to one terminal of multiplexers 411 and 412. The other input of multiplexer 411 is signal +Vth. The other input of multiplexer 412 is signal −Vth. A node select switch 413 is coupled to multiplexer 411 and 412 to select between the input signals. The output of multiplexer 411 is coupled to the inverting input of amplifier 406 of quantizer 404. The output of multiplexer 412 is coupled to the non-inverting input of amplifier 407. Node 401 is coupled to the non-inverting input of amplifier 406 and to the inverting input of amplifier 407.

The mode select signal 413 is set for either tracking or acquisition mode. In acquisition mode, multiplexers 411 and 412 are set to receive the input from multiplexer 409. The output of multiplexer 409 is set to either of +vth' and −Vth'. In the acquisition mode, the quantizer 404 receives the same input from the multiplexers 411 and 413, either +Vth' or −Vth'.

In the tracking mode, mode select switch sets multiplexer 411 to receive signal +Vth and sets multiplexer 412 to receive signal −Vth. The quantizer 404 thus receives different input signals from the respective multiplexers.

A disadvantage of the approach of FIG. 4 is that it requires several multiplexers to switch between the thresholds, and the thresholds are different for the acquiring and tracking modes. Also, the quantizer architecture is different from well known architectures. Therefore, additional hardware is required to implement the VTD algorithm.

SUMMARY OF THE INVENTION

A method and apparatus for timing acquisition of partial response class IV Signaling is described. The invention uses an acquisition logic block to determine an output sequence that best matches a preamble pattern. The logic block analyzes current quantizer output X and the two previous decisions $X_n$ and $X_{n-1}$. The logic uses these values to determine the next value $X_{n+1}$ so that the best match occurs. The invention is implemented with OR gates, AND gates, and D flip-flops and can operate in acquiring mode or tracking mode.

BRIEF DESCRIPTION OF THE DRAWINGS

FIG. 4 is a prior art circuit for implementing a VTD algorithm for acquiring a PR4 preamble pattern.

FIG. 5 is a phase detector for acquiring mode of the present invention.

FIG. 6 is a PR-IV phase detector Circuit of the present invention.

DETAILED DESCRIPTION OF THE INVENTION

A method and apparatus for timing acquisition of partial response class IV signaling is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

During timing acquisition, the input signal is expected to have a value of −1 or 1. The value is determined by comparing the input signal to references at a high and low threshold. However, the input signal detected may fail to exceed these thresholds (zero value). The present invention provides a method for outputting an appropriate value whenever the input signal does not exceed the reference thresholds.

Timing Acquisition

Figure 1:
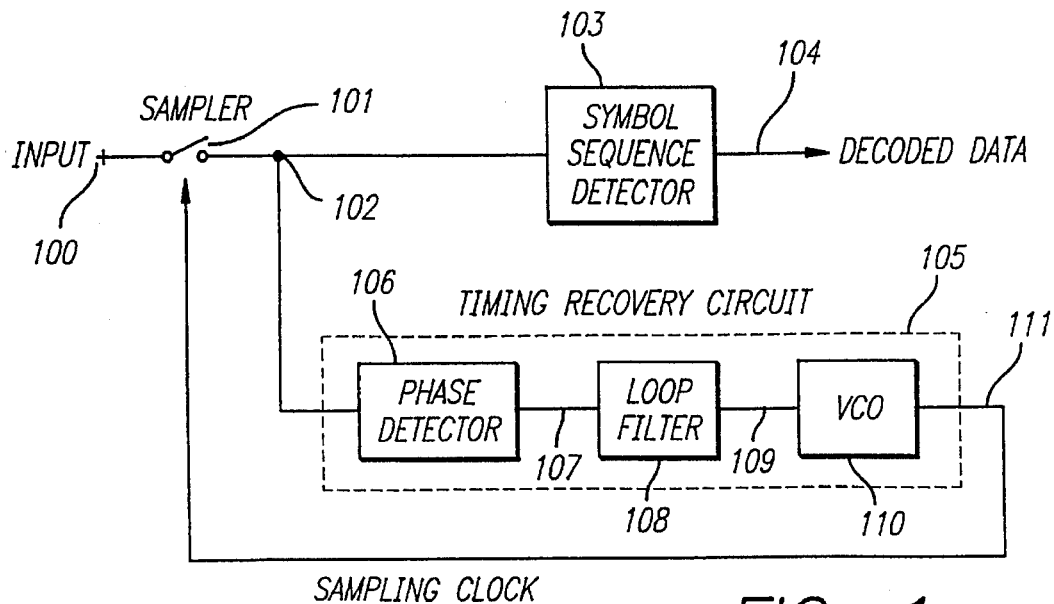
FIG. 1 illustrates an example of a prior art PR-IV decoder.
Figure 2:
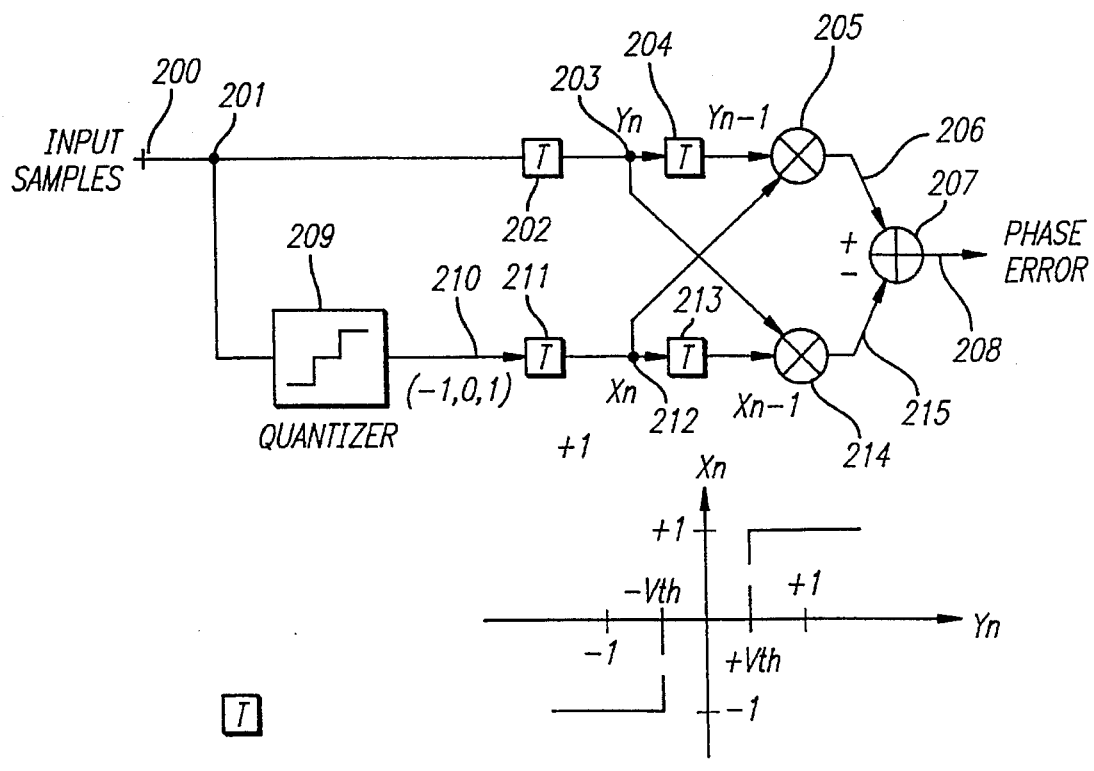
FIG. 2 illustrates a prior art phase detector for tracking mode.
Figure 3:
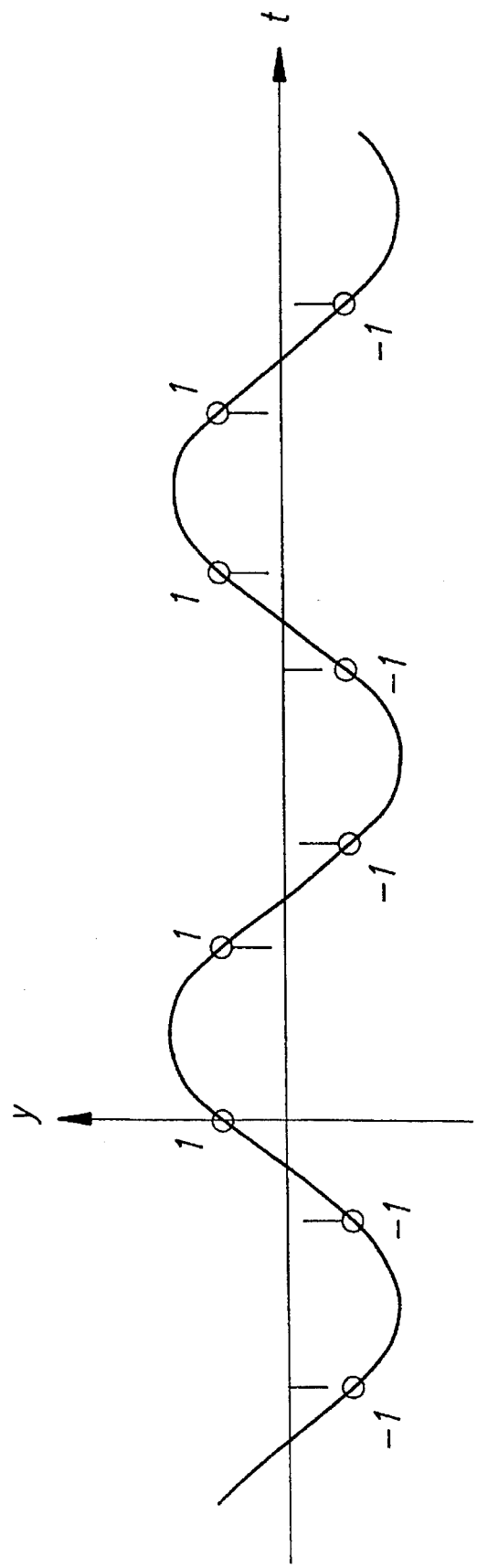
FIG. 3 illustrates a prior art PR-IV preamble pattern.

FIG. 5 is a block diagram of the timing acquisition scheme of the present invention. FIG. 5 is a phase detector for acquiring mode of the present invention. The circuit of FIG. 5 is similar to the circuit of FIG. 2 and like numerals are used to describe like elements. The circuit of FIG. 5 has the addition of an acquisition logic circuit 504 between quantizer 502 and delay 211. Input samples 200 are coupled to node 501. Node 501 is coupled as an input to delay 202 and to quantizer 502. The output 503 of quantizer 502 is signal X and is provided as an input to acquisition logic block 504. Mode signal 510 is also coupled as an input to acquisition logic block 504. The output 505 of acquisition logic block 504 is coupled as an input to delay 211. Signal $X_n$ at node 212 is coupled in a feed back loop to acquisition logic block 504. Signal $X_n$ −1 at node 402 is also coupled in a feed back loop to acquisition logic block 504.

The system of FIG. 5 includes an acquisition logic block 504 inserted after the quantizer 502. This logic block looks at the output (X) from the quantizer and the previous two decision values (Xn and Xn−1, from delay blocks 211 and 213 respectively). The logic then determines what the next Xn+1 decision should be so that the output sequence would best match the preamble pattern. The acquisition logic is shown in Table I below.

TABLE 1

| | Acquisition Logic | | |
|---|---|---|---|
| $X_{n-1}$ | $X_n$ | X | Logic Output |
| −1 | −1 | 0 | 1 |
| −1 | 1 | 0 | 1 |
| 1 | −1 | 0 | −1 |
| 1 | 1 | 0 | −1 |
| X | X | 1 | 1 |
| X | X | −1 | −1 |

X = don't care state.

The acquisition logic block forces the output to be the {. . . −1, −1, +1, +1, −1, −1, . . . } preamble pattern when the input sample values fail to exceed either the positive or negative threshold. When the input sample is detected as −1 or 1, the output of the logic block is the same as the input sample regardless of the previous two output values. It is only when the input signal is an unexpected value, such as 0, when the acquisition logic is used. The logic looks at the two most recent output values and provides an output value that continues the sequence . . . −1, −1, 1, 1, −1, −1, . . . so that preamble detect is provided. Mode signal 510 enables operation of the acquisition logic block 504 during acquisition phase and disables operation of block 504 during tracking phase.

FIG. 6 illustrates a PR-IV phase detector circuit of the preferred embodiment of the present invention. The circuit illustrates a preferred embodiment of the quantizer 502, acquisition logic 504, and delays 211 and 213 of FIG. 5. Signals +Vth, 200 and −Vth are provided as inputs to the quantizer consisting of comparator 601 and 602. Signal +Vth is provided as an input to the inverting input of comparator 601. Signal −Vth is provided to the non-inverting input of comparator 602. Input 200 is coupled to the noninverting input of comparator 601 and to the inverting input of comparator 602. The output of comparator 601 is coupled to node 603 and the output of comparator 602 is coupled to node 604.

The acquisition logic of FIG. 6 is comprised of AND gates 611, 615 and 618, OR gates 605, 606 and 614, and inverter 608. Node 603 is coupled as one input to OR gate 605. The output 609 of OR gate 605 is coupled to one input of AND gate 611. Signal 607 from node 604 is coupled through inverter 608 to the other input of AND gate 611, signal 610. Node 603 and node 604 are coupled as inputs to OR gate 606. The output 613 of OR gate 606 is coupled as an input to OR gate 614. MODE signal is coupled as an input to AND gate 615 and AND gate 618. The output 616 of AND gate 615 is coupled as the other input of OR gate 614. The output 619 of AND gate 618 is coupled as an input to OR gate 605. The output 612 of AND gate 611 is coupled to the D input of D flip-flop 621. The output 617 of OR gate 614 is coupled to the D input of D flip-flop 619.

Signal VCO CLOCK is coupled to the clock input of flip-flops 619, 620, 621 and 622. RESET* signal is coupled to the RESET* input of flip-flops 619–622. The Q output of D flip-flop 621 is signal $XA_n$ and is also coupled to the D input of flip-flop 622. The Q output of flip-flop 622 is signal $XA_n -1$. The Q* output of flip-flop 622 is coupled as the other input of AND gate 618. The Q output of flip-flop 619 is signal $XB_n$ and is coupled to the D input of flip-flop 620 and to the other input of AND gate 615. The Q output of flip-flop 620 is signal $XB_n-1$.

Because Xn could have one of three values (−1, 0 or 1), two binary bits (XAn and XBn) are needed to represent one Xn value. The mapping between the binary data and the Xn values is given in Table 2. When XBn is 0, Xn is 0 regardless of the value of XAn. When XAn is 0 and XBn is 1, Xn is −1. When both XAn and XBn are 1, Xn is 1.

In addition to the acquisition logic, this circuit also includes reset and mode select functions. The mode select signal is a logical 1 in the acquisition mode, enabling AND gates 615 and 618. These AND gates permit the feedback of the delay outputs to the acquisition logic. The mode select signal is a logical 0 in the tracking mode, effectively disabling AND gates 615 and 618 and removing feedback to the acquisition logic.

The present invention operates with the same thresholds in both tracking and acquisition mode, simplifying circuitry over prior art schemes.

TABLE 2

| Mapping Between XAn, XBn, and Xn | | |
|---|---|---|
| XAn | XBn | Xn |
| 0 | 0 | 0 |
| 1 | 0 | 0 |
| 0 | 1 | −1 |
| 1 | 1 | 1 |

Other logic configurations may be used in the present invention without departing from the scope of the invention. Any logic configuration may be used so long as it provides outputs as described in Table 1.

Thus, a method and apparatus for timing acquisition of partial response class IV signaling has been described.

I claim:

1. A phase detector comprising:

quantizing means coupled to an input signal, said quantizing means outputting a quantized signal X;

logic means coupled to said quantizing means and receiving said quantized signal, said logic means providing as output a prediction signal, said logic means receiving as input first and second previous prediction signals $X_n$ and $X_{n-1}$, said prediction signal having a value dependent on said first and second previous prediction signals and said quantized signal X.

2. The phase detector of claim 1 further including:

first delay means coupled to said logic means for receiving said prediction signal, said first delay means providing as output said first previous prediction signal $X_n$;

second delay means coupled to said first delay means for receiving $X_n$, said second delay means providing as output said second previous prediction signal $X_{n-1}$.

3. The phase detector of claim 2 further comprising:

third delay means coupled to said input signal for providing as output a first delayed input signal $Y_n$;

fourth delay means coupled to said third delay means for providing as output a second delayed input signal $Y_{n-1}$;

first multiplying means coupled to said second and said third delay means for multiplying $X_{n-1}$ and $Y_n$ and for producing a first phase output;

second multiplying means coupled to said first and said fourth delay means for multiplying $Y_{n-1}$ and $X_n$ and for producing a second phase output;

a summing node coupled to said first and second phase outputs for producing as output a phase error signal.

4. The phase detector of claim 1 wherein said prediction signal takes the values . . . −1, −1, 1, 1, −1, −1, 1, 1, −1, −1 . . .

5. The phase detector of claim 1 wherein said prediction signal has a value of X when X has a value of 1 and −1.

6. The phase detector of claim 5 whereto said logic output has an output as follows when X has a value of 0:

| $X_{n-1}$ | $X_n$ | Logic Output |
|---|---|---|
| −1 | −1 | 1 |
| −1 | 1 | 1 |
| 1 | −1 | −1 |
| 1 | 1 | −1 |

7. The phase detector of claim 1 wherein said quantizing means comprises:

a first comparator coupled to a first reference value and to said input signal;

a second comparator coupled to a second reference value and to said input signal.

8. The phase detector of claim 7 wherein said first reference is the negative of said second reference.

9. The phase detector of claim 7 wherein said first reference is coupled to the inverting input of said first comparator and said second reference is coupled to the non-inverting input of said second comparator.

10. The phase detector of claim 2 wherein said logic means comprises:

a first OR gate coupled to an output of said first comparator and to an output of a first AND gate;

a second AND gate coupled to an output of said first OR gate and to an inverted output of said second comparator;

a second OR gate coupled to said output of said first comparator and to an output of said second comparator;

a third OR gate coupled to an output of a third AND gate and to an output of said second OR gate;

said second AND gate and said third OR gate providing outputs to said first delay means.

11. The phase detector of claim 10 wherein said second AND gate is coupled to a mode select signal and to the inversion of said previous prediction signal Xn−1.

12. The phase detector of claim 11 wherein said third AND gate is coupled to said mode select signal and said previous prediction signal Xn.

13. A phase detector comprising:

quantizing means coupled to an input signal, said quantizing means outputting a quantized signal X, said quantizing means comprising a first comparator coupled to a first reference value and to said input signal and a second comparator coupled to a second reference value and to said input signal;

logic means coupled to said quantizing means and receiving said quantized signal, said logic means providing as output a prediction signal, said logic means receiving as input first and second previous prediction signals $X_n$ and $X_{n-1}$, said logic means comprising a first OR gate coupled to an output of said first comparator and to an output of a first AND gate, a second AND gate coupled to an output of said first OR gate and to an inverted output of said second comparator, a second OR gate coupled to said output of said first comparator and to an output of said second comparator, a third OR gate coupled to an output of a third AND gate and to an output of said second OR gate;

said prediction signal having a value dependent on said first and second previous prediction signals and said quantized signal X.

14. The phase detector of claim 13 further including:

first delay means coupled to said logic means for receiving said prediction signal, said first delay means providing as output said first previous prediction signal $X_n$;

second delay means coupled to said first delay means for receiving Xn, said second delay means providing as output said second previous prediction signal $X_{n-1}$.

15. The phase detector of claim 14 further comprising:

third delay means coupled to said input signal for providing as output a first delayed input signal $Y_n$;

fourth delay means coupled to said third delay means for providing as output a second delayed input signal $Y_{n-1}$;

first multiplying means coupled to said second and said third delay means for multiplying $X_{n-1}$ and $Y_n$ and for producing a first phase output;

second multiplying means coupled to said first and said fourth delay means for multiplying $Y_{n-1}$ and $X_n$ and for producing a second phase output;

a summing node coupled to said first and second phase outputs for producing as output a phase error signal.

16. The phase detector of claim 13 wherein said prediction signal takes the values . . . −1, −1, 1, 1, −1, −1, 1, 1, −1, −1 . . . .

17. The phase detector of claim 13 wherein said prediction signal has a value of X when X has a value of 1 and −1.

18. The phase detector of claim 17 wherein said logic output has an output as follows when X has a value of 0:

| $X_{n-1}$ | $X_n$ | Logic Output |
|---|---|---|
| −1 | −1 | 1 |
| −1 | 1 | 1 |
| 1 | −1 | −1 |
| 1 | 1 | −1 |

19. The phase detector of claim 13 wherein said first reference is the negative of said second reference.

20. The phase detector of claim 19 wherein said first reference is coupled to the inverting input of said first comparator and said second reference is coupled to the non-inverting input of said second comparator.

21. The phase detector of claim 13 wherein said second AND gate and said third OR gate provide outputs to said first delay means.

22. The phase detector of claim 21 wherein said second AND gate is coupled to a mode select signal and to the inversion of said previous prediction signal Xn−1.

23. The phase detector of claim 22 wherein said third AND gate is coupled to said mode select signal and said previous prediction signal Xn.

\* \* \* \* \*